(12) United States Patent
Franz

(10) Patent No.: US 6,475,819 B2
(45) Date of Patent: Nov. 5, 2002

(54) METHOD FOR FORMATION AND PRODUCTION OF MATRICES OF HIGH DENSITY LIGHT EMITTING DIODES

(75) Inventor: Gerhard Franz, Munich (DE)

(73) Assignee: Osram Opto Semiconductors GmbH & Co. OHG, Regensburg (DE)

( * ) Notice: Subject to any disclaimer, the term of this patent is extended or adjusted under 35 U.S.C. 154(b) by 20 days.

(21) Appl. No.: 09/750,286

(22) Filed: Dec. 29, 2000

(65) Prior Publication Data

US 2001/0041410 A1 Nov. 15, 2001

Related U.S. Application Data

(63) Continuation of application No. PCT/DE99/01693, filed on Jun. 10, 1999.

(30) Foreign Application Priority Data

Jun. 29, 1998 (DE) ........................................ 198 28 970

(51) Int. Cl.[7] ............................................... H01L 21/00
(52) U.S. Cl. ........................ 438/34; 438/706; 438/738
(58) Field of Search ................................ 156/297–299, 156/622.1, 633.1, 649.1, 659.11; 216/2, 18, 20, 33, 39; 257/88–93, 99, 102, 103; 438/34, 35, 39, 42, 45, 46, 47, 483, 488, 493, 494, 503, 504, 706, 712, 714, 717, 718, 736, 738

(56) References Cited

U.S. PATENT DOCUMENTS 5,300,788 A 4/1994 Fan et al.
5,449,926 A 9/1995 Holm et al.

FOREIGN PATENT DOCUMENTS

DE 4016698 A1 11/1991
DE 19632626 A1 2/1998
EP 0683527 A1 11/1995
EP 0747948 A2 12/1996

OTHER PUBLICATIONS

Patent Abstracts of Japan, Pub. No. 06350136A, Pub. Date Dec. 22, 1994.

European Patent Office, Patent Abstracts of Japan, Pub. No. 61214587, Pub. Date Sep. 24, 1986.

European Patent Office, Patent Abstracts of Japan, Pub. No. 63094656, Pub. Date Apr. 25, 1988.

Primary Examiner—Michael Sherry
Assistant Examiner—Asok Kumar Sarkar
(74) Attorney, Agent, or Firm—Jacob Eisenberg

(57) ABSTRACT

A method for the production and formation of microscopic semiconductor light emitting diodes Is set out. The method comprises the steps of: producing a semiconductor light emitting device (100) including a pn-junction (24) and metallization layers (6, 7); applying an etching mask (9–11) with a preset structure on one side of the semiconductor device (100), whereby the masked areas of the arrangement form and correspond to the diodes to be formed (30); applying a carrier (8, 12) on the other side of the semiconductor device (100); vertically etching the semiconductor material in the openings of the etching mask (9–11) to the carrier (8, 12) and thereby producing a diode arrangement containing a multiple number of diodes (30) below the masked areas. In addition, the method further comprises: removing the etching mask (9–11); providing an accommodating device (20) containing slots (22) with an arrangement and form that correspond to the numerous diodes, whereby the slots are suited for the reception of the diodes (30) therein; engaging the diode arrangement into the accommodating device (20); and removing of the carrier (8, 12). This method can be used for the production of a LED display device having a high pixel density.

22 Claims, 8 Drawing Sheets

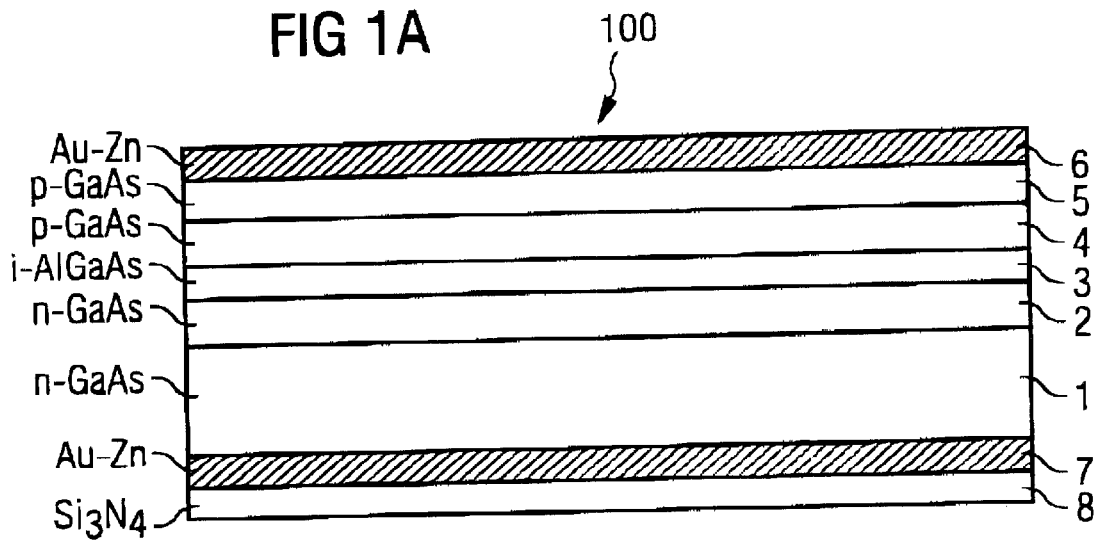
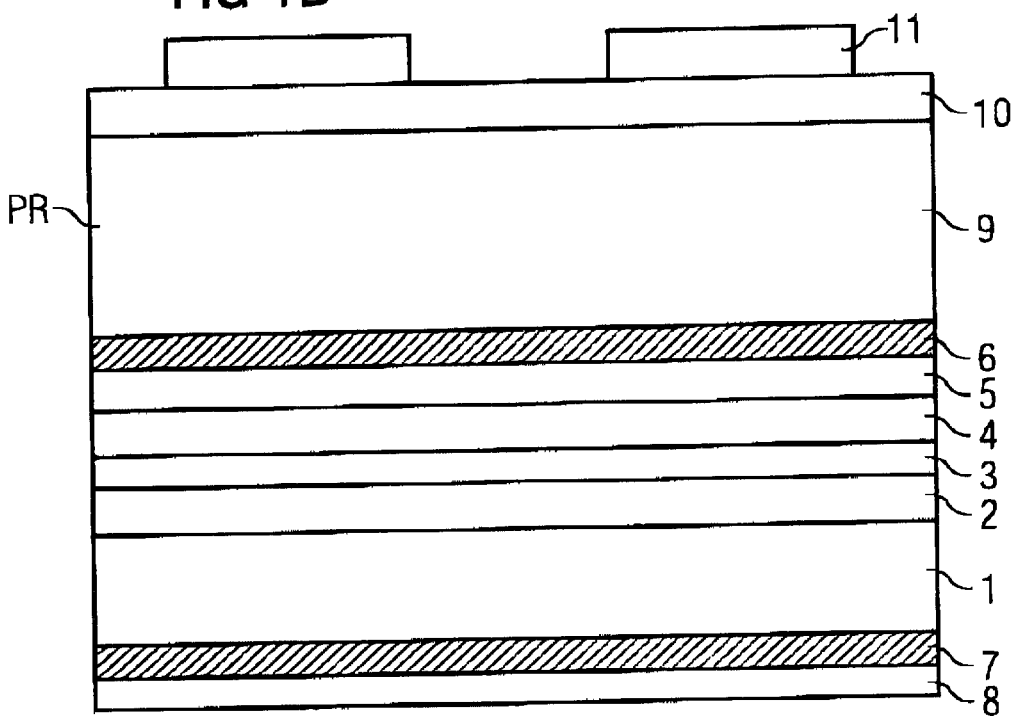

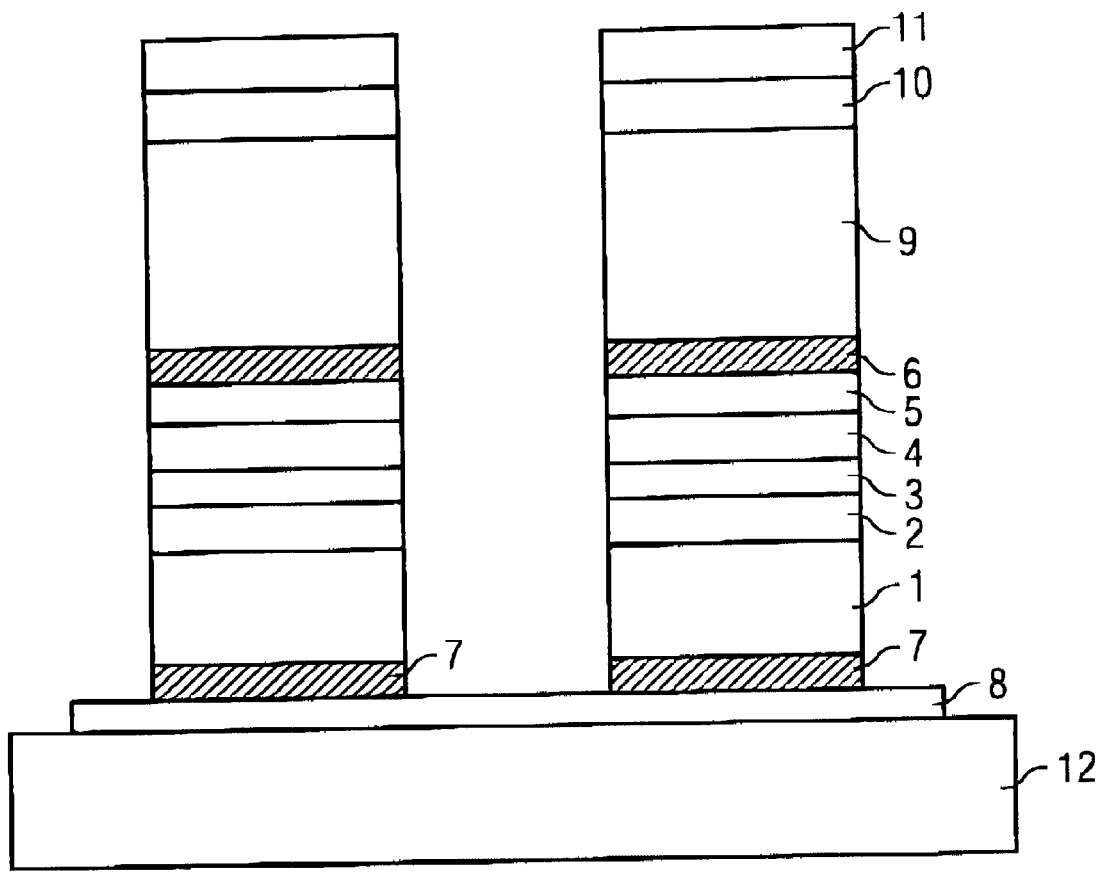
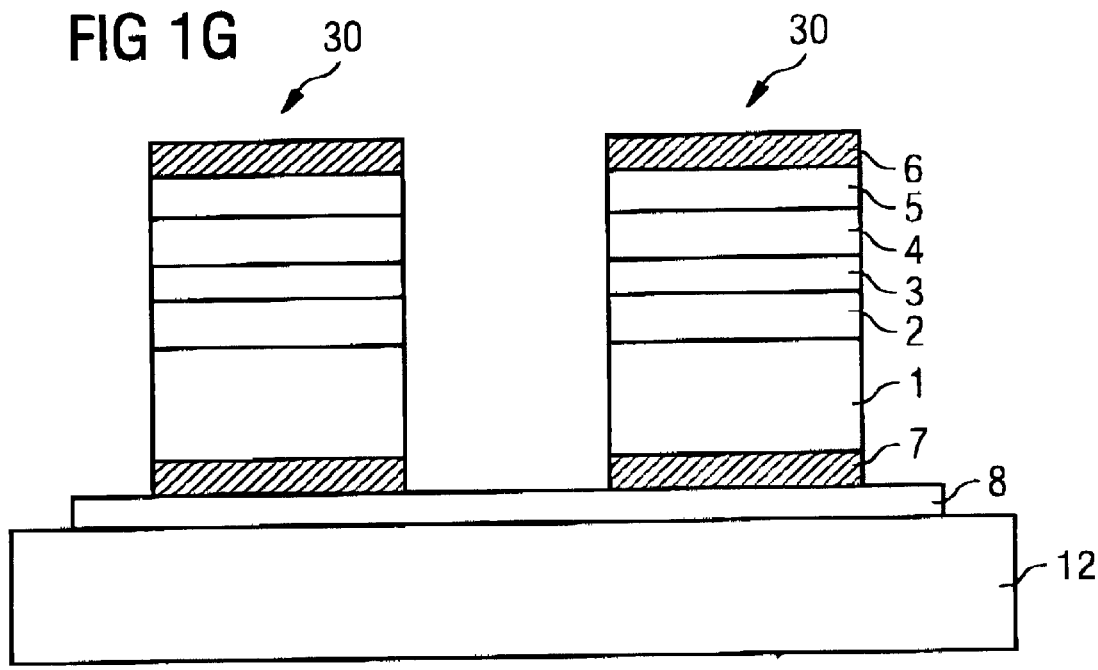

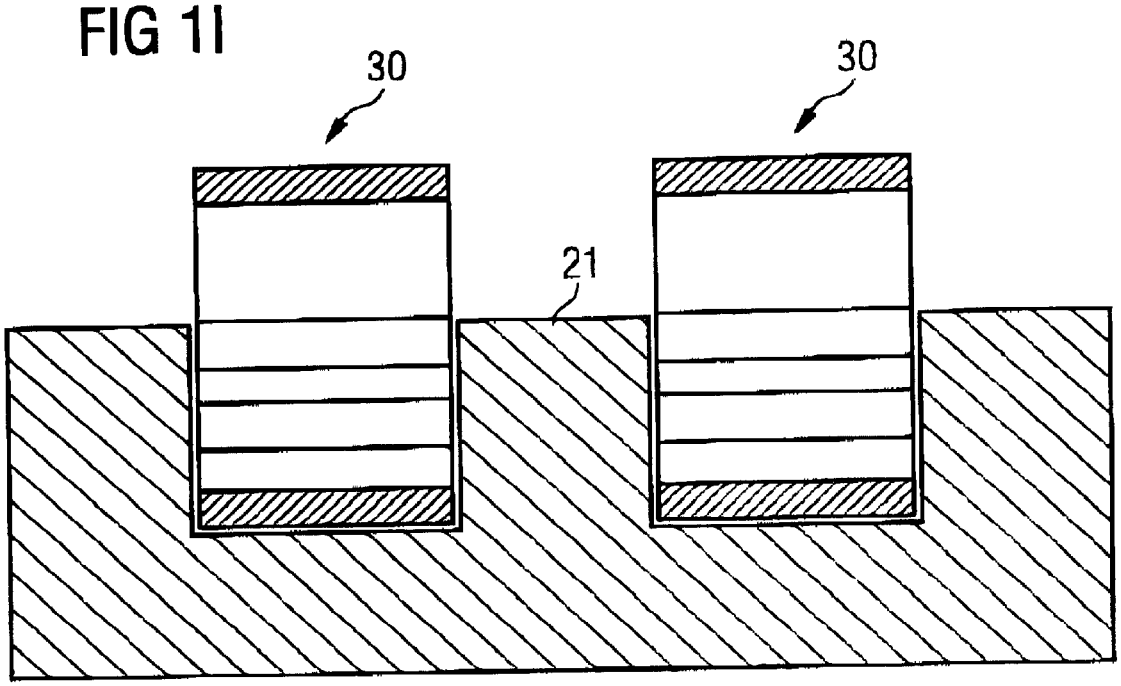

METHOD FOR FORMATION AND PRODUCTION OF MATRICES OF HIGH DENSITY LIGHT EMITTING DIODES

CROSS REFERENCE TO RELATED APPLICATIONS

This application is a continuation of copending international application PCT/DE99/01693, filed Jun. 10, 1999, which designated the United States.

BACKGROUND OF THE INVENTION

1. Field of the Invention

The present invention relates to a method for producing and forming semiconductor light emitting diodes (LEDs), as well as to the production of light emitting display devices formed by the light emitting diodes. In particular, the present invention relates to a method of forming densely packed matrices of semiconductor LEDs which may be individually controlled.

2. Description of Related Art

In the field of display devices and displays in general, conventional cathode radiation tubes are being increasingly replaced, in many areas of application, by flat displays such as liquid crystal displays (LCDs). The use of LCDs include a number of known disadvantages, including poor luminosity, directional dependence for visual impression, and slow response speed. Even though these problems are not unsolvable, they can for the most part only be coped with by the use of considerable energy. This is partly based on the fact that the emitted light displayed by the device in the direction of the observer is produced subtractively, i.e. by filtering of externally irradiated light, wherein an active medium, normally a liquid crystal, performs the function of a controllable light filter. An additional source of the present problems stems from the characteristics of the active mediums predominant use of liquid crystals.

As a result of the aforementioned difficulties, there have been considerations of display devices wherein light production processes take place additively, i.e. by independent light emitting elements such as light emitting diodes. The light emitting diodes are normally arranged in a matrix, such as with the cells of a LCD display. In addition it is required that such LEDs be controllable. Such display devices were limited in the past to either display devices of medium informational content such as digital displays, or alphanumerical displays with a low number of pixels in the matrix. But large area display devices with high informational content have proven to be difficult in the past because of their complexity and high loss capacity. As a result, large area displays have not emerged from the experimental stage. Large scale production of large numbers of microscopically small and individually controlled semiconductor light emitting diodes in a tight matrix, i.e. with a very high density, have also not been particularly successful nor satisfactory.

A method for the production and formation of LED semiconductor chips is to known from German reference DE 196 32 626, wherein a semiconductor layering sequence is applied, with an active zone, on a substrate, by metal organic gas phase epitaxy (MOVPE). The layering sequence is equipped with at least one mesa ditch, formed by dry cauterization and having a depth which is sufficient such that the active zone of the layering sequence can be separated. Thereafter, the combination of substrate and layering sequence is sectioned in such a way that at least one semiconductor body, or if desired a number of semiconductor bodies, are individually created with at least one mesa flank. However, the reference does not discuss how a majority of semiconductor bodies can be put under individual control nor further processed after the separation process.

Japanese reference JP 06350136 A sets out a method wherein an integral semiconductor body, having: a layering sequence; an active zone; and contacting metallizations; is installed on an adhesive area. Thereafter, individual LED chips are produced by etching, such that individual LED chips are arranged on an adhesive area and can be further processed and respectively contacted. But the use of an adhesive area is relatively elaborate, because initially a secure adhesion had to be ensured, and later on in the manufacturing process a chemical process has to employed for the chips removal from the adhesive area.

German reference DE 40 16 698 A1 describes a support carrier using suction for the transfer of pieces, whereby the pieces are detachable from the suction carrier and are specifically positioned and otherwise precisely oriented. The suction carrier provided with Individually controllable chambers for which the pieces to be transferred are assigned. The production and application of LED cells is also described.

European reference 0 683 527 A1 describes a method for producing a light emitting diode arrangement having a high density, wherein on the semiconductor substrate following a first electrical contacting layer of a highly doped semiconductor material, an active layering sequence and a second electrical contacting layer are applied. By etching steps of various depth in columns or lines, electrically insulated LEDs are produced in columns or lines, which are arranged in a matrix shape and can be controlled individually and electrically. But with this method the LEDs themselves are not individually produced.

BRIEF SUMMARY OF THE INVENTION

It is therefore an object of the present invention, to provide a method for production and formation of small semiconductor light emitting diodes. It Is a further object of the present Invention, to produce a display device on the basis of this method, the display device having a high pixel density and comprising semiconductor light emission diodes. In addition, it is an object of the invention to produce the semiconductor LEDs in a tight matrix wherein each LED may be individually controlled. Furthermore, it is an object of the invention that the masks be of sufficient integrity so as to accommodate appropriate etching so as to satisfy tight requirements of a dense matrix. It is another object of the invention to provide a method which can be implemented so as to enable mass production at reasonable engineering effort and expense and with maximally replicable component characteristics. It is still further an object of the invention to enable the production and individual formation of microscopic semiconductor light emitting diodes and subsequently their separate association, via micromechanical tooling, with electrical contacting for use in an additive display device.

The present invention comprises a method for the production and formation of semiconductor light emitting diodes comprising the steps of: producing a semiconductor light emitting device having at least one pn-junction and at least one metallization layer; applying an etching mask having a first mask arrangement on one side of the semiconductor device, said arrangement defining covered and open areas of the semiconductor device; applying a supporting layer on the other side of the semiconductor device; vertically etching the semiconductor material within said open areas from said one side to said carrier; removing said etching mask thereby exposing remaining portions of said semiconductor light emitting device not previously covered by said mask, said remaining portions comprising light emitting diodes; engaging said light emitting diodes with an accommodating device, said device comprising slots arranged to individually receive each of said light emitting diodes; and removing said carrier.

The invention is explained in greater detail below and by reference to exemplary embodiments shown in the drawings.

BRIEF DESCRIPTION OF THE DRAWINGS

FIGS. 1A to 1I depict steps for the production and formation of GaAs-LEDs;

DESCRIPTION OF PREFERRED EMBODIMENTS

Figure 1C:
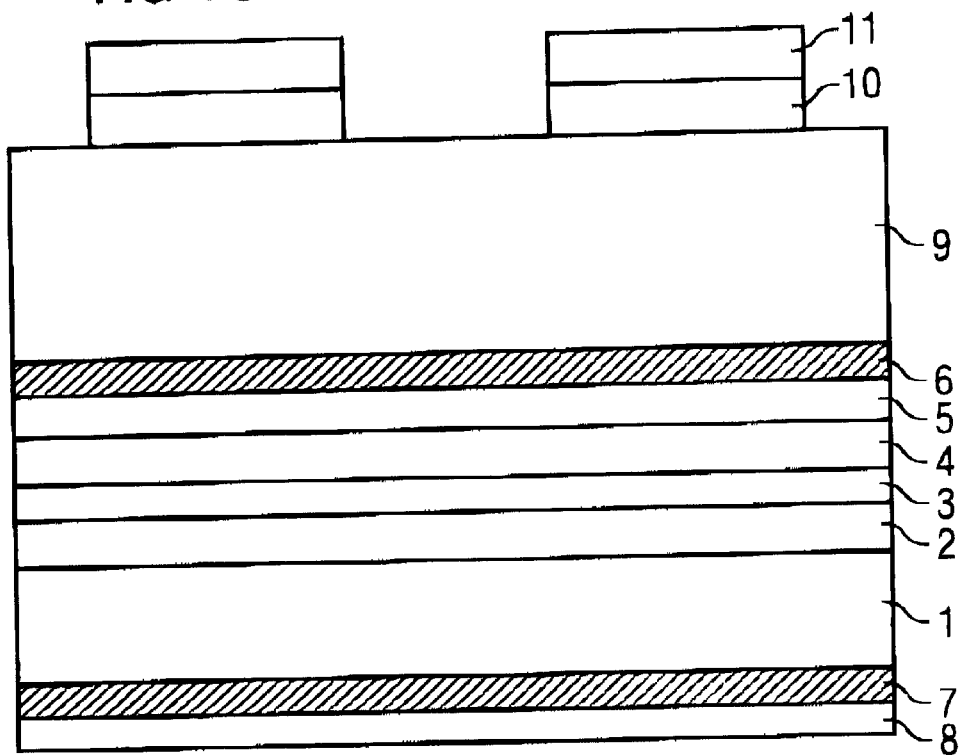

Reference is now made to the figures of the drawings wherein identical or functionally equivalent elements are identified by the same reference numerals. The method according to the invention comprises essentially therein steps for producing periodic deepening pattern by photolithography and reactive etching techniques in a semiconductor device which comprises a LED structure. In further steps, Pillars and pilasters of the semiconductor material are left between the slots, from which the thinned out microscopic semiconductor LEDs are produced. GaAs may be used as a base semiconductor material as set out in more detail below.

First, production of a semiconductor light emission device 100 is set out with initial reference to FIG. 1A. As depicted herein, a n-doped (interference density approx. $10^{18}$–$10^{19}$ cm$^{-3}$) GaAs wafer 1 (diameter 2 inches) with a thickness of approx. 100 $\mu$m is used as an initial material. A plurality of layers are applied on both sides of the wafer, within for example a square centered section of the wafer. A first metallization layer 7 (shown hatched) is precipitated on the backside of the wafer, the layer comprising for example Au—Zn. This metallization layer 7 will later serve as an n-contact of the light emitting diode. A supporting layer 8 of Si$_3$N$_4$ is precipitated on the metallization layer 7. The function of the supporting layer will be discussed in more detail below. The supporting layer 8 may comprise SiO$_2$ and is preferably precipitated by PE-CVD (Plasma Enhanced Chemical Vapor Deposition) although other application methods including sputtering can also be employed as known to one skilled in the art.

On the top surface of the GaAs wafer 1, the actual LED structure in the form of semiconductor layers 2 to 5 may now be applied. Various conventional growth methods, including molecular beaming epitaxy (MBE), metal organic chemical vapor deposition (MOCVD) and metal organic molecular beaming epitaxy (MOMBE) may be used as a growth method.

A first wave guide layer 2 of n-doped GaAs is applied. An active, light-producing layer 3 is grown thereon. This active layer consists of intrinsic, i.e. nominally non-doped semiconductor material. The semiconductor material of the active layer 3 is AlGaAs in the present embodiment, so that the wavelength of the active layer emitted light lies approximately in the red spectrum. Naturally, just about every other III-V-semiconductor material can be used depending on the desired emitted wavelength. A second wave-guiding layer 4 of p-doped GaAs is grown on active layer 3. Then a p-doped contacting layer 5 with a high interference concentration (approx. $10^{20}$ cm$^3$) is layered thereon. Finally, a second metallization layer 6 is applied, which again may consist of Au—Zn. The whole thickness of layers 2 to 6 is preferably approximately 5–20 $\mu$m.

The chosen presentation is therefore not true to the scale given the thickness of wafer 1 at 100 $\mu$.

By the aforementioned steps, the pn-junction from the layers 2 to 4 is formed If, during operation, a current is injected through the metallic contacting layers 6 and 7 into the LED structure, recombination of electrons and holes ensues and light emission in the area of the active layer 3 occurs. The emitting light spreads on the level of the active layer 3 and exits from a finished LED via its side borders.

Figure 5:
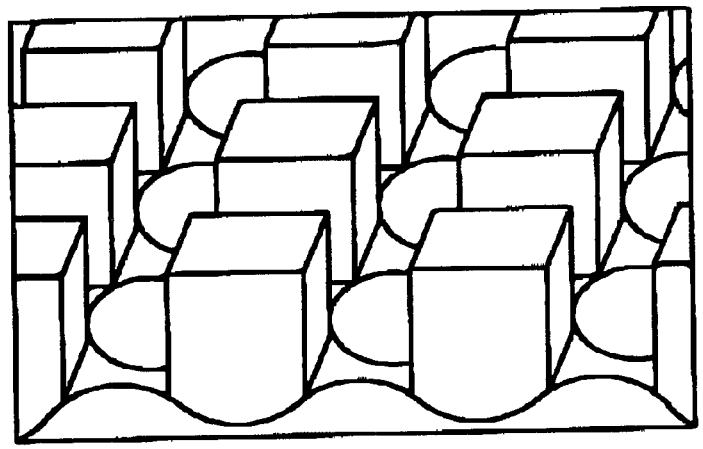
FIG. 5 depicts a raster electron microscopic inclusion of a GaAs sample, in which a periodic punch pattern was produced by etching.

The structure according to FIG. 1A will now be used as a base to a description of the structuring process by which a regular arrangement of individual free standing pilaster-like GaAs-LEDs are produced. For example, a raster electron. microscopic picture of an etched GaAs sample is shown in FIG. 5. Herein is depicted a regular arrangement of individual LEDs, whose square base is approximately 100 $\mu$m at a raster of approximately 300 $\mu$m. After an etching through approximately 95 $\mu$m the pilasters present themselves directly below an etching mask of AL$_2$O$_3$ photoresist with vertical flanks narrowed in the middle to wider ends.

The structuring process will now be set out in more detail with reference to FIGS. 1A to 1I The structuring of two neighboring GaAs pilasters is shown in the figures.

Figure 1D:
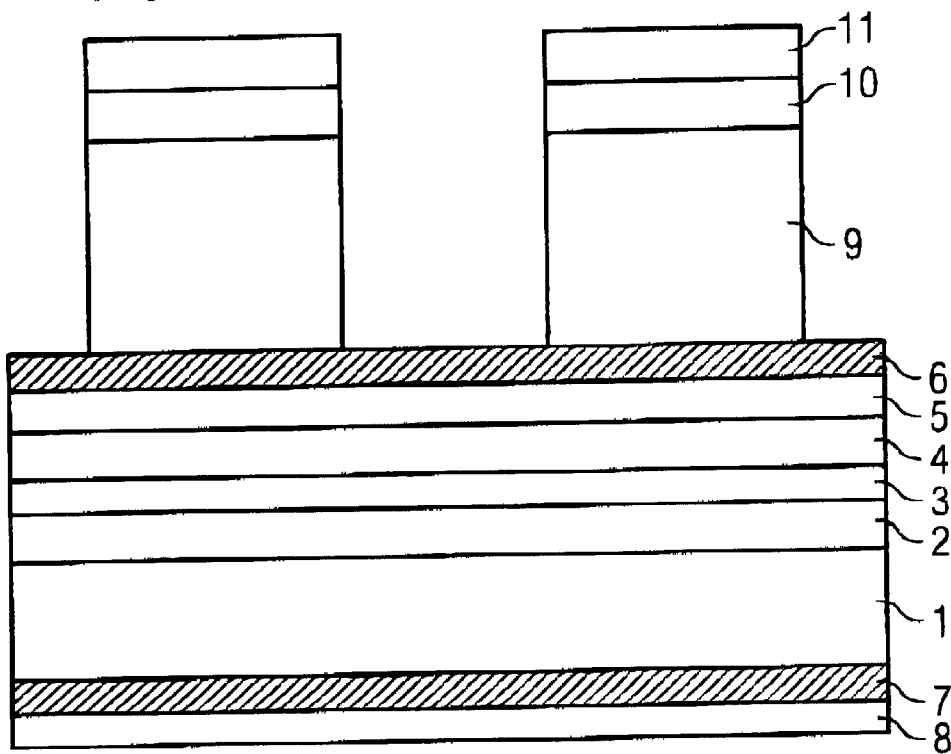

FIGS. 1B to 1D depict method steps which serve to produce a relatively thick photoresist structured etching mask 9–11 on the second metallization layer 6. First, as depicted in FIG. 1B, a relatively thick first photoresist layer 9, for example the photoresist AZ 4533 or AZ4562, is applied onto the second metallization layer 6. The thickness of the first photoresist layer 9 is preferably between 6 and 10 $\mu$m. A supporting layer 10 is applied to the first photoresist layer 9 by RFR sputtering or Ion beam sputtering, which for example may comprise one of SiO$_2$, Al$_2$O$_3$ and SI$_3$N$_4$ and preferably has a thickness of approximately 200 nm. Again a second, relatively thin, photoresist layer 11 with a thickness of preferably 1.5–2 $\mu$m is applied onto supporting layer 10. This may comprise the above mentioned resist materials AZ 4533 or AZ 4562. This will be, as apparent from FIG. 1B, structured by photolithography in such a known way that its structure corresponds to a select GaAs-LED matrix to be produced. In the case on hand a resist mask, consisting of a dense matrix of square resist areas, is produced. The zones which lie under these square resist areas of the semiconductor device shall also be formed on to the pilaster shaped GaAs-LEDs. Naturally, a matrix, of for example circle shaped resist areas, can also be produced for the later production of pillars like GaAs-LEDs. FIG. 1C depicts results of a method step wherein the resist mask is first, by reactive dry etching and preferably by use of fluoride-chemistry, for example pure CF$_4$ or CF$_4$O$_2$, formed into the supporting layer 10.

FIG. 1D depicts results of a method step wherein the mask structure is formed into the photoresist layer 9 by reactive dry etching and preferably by use of oxygen chemistry, for example $O_2$/Ar. As a result, layers 9–11 have approximately the same width.

As now produced and shown in FIG. 1D layers 9 to 11, an existing resist mask allows the achievement of a very high lateral structured integrity for the etching of the GaAs structure. Problems based on running and rounding of the photoresist mask would arise at the structure flanks with use of a simpler resist layer. However, with the resist mask of FIG. 1D, not only based on its thickness but also based on the intermediate lying supporting layer 10, a relatively high form of resistance towards the following etching steps may ensue.

Figure 1E:
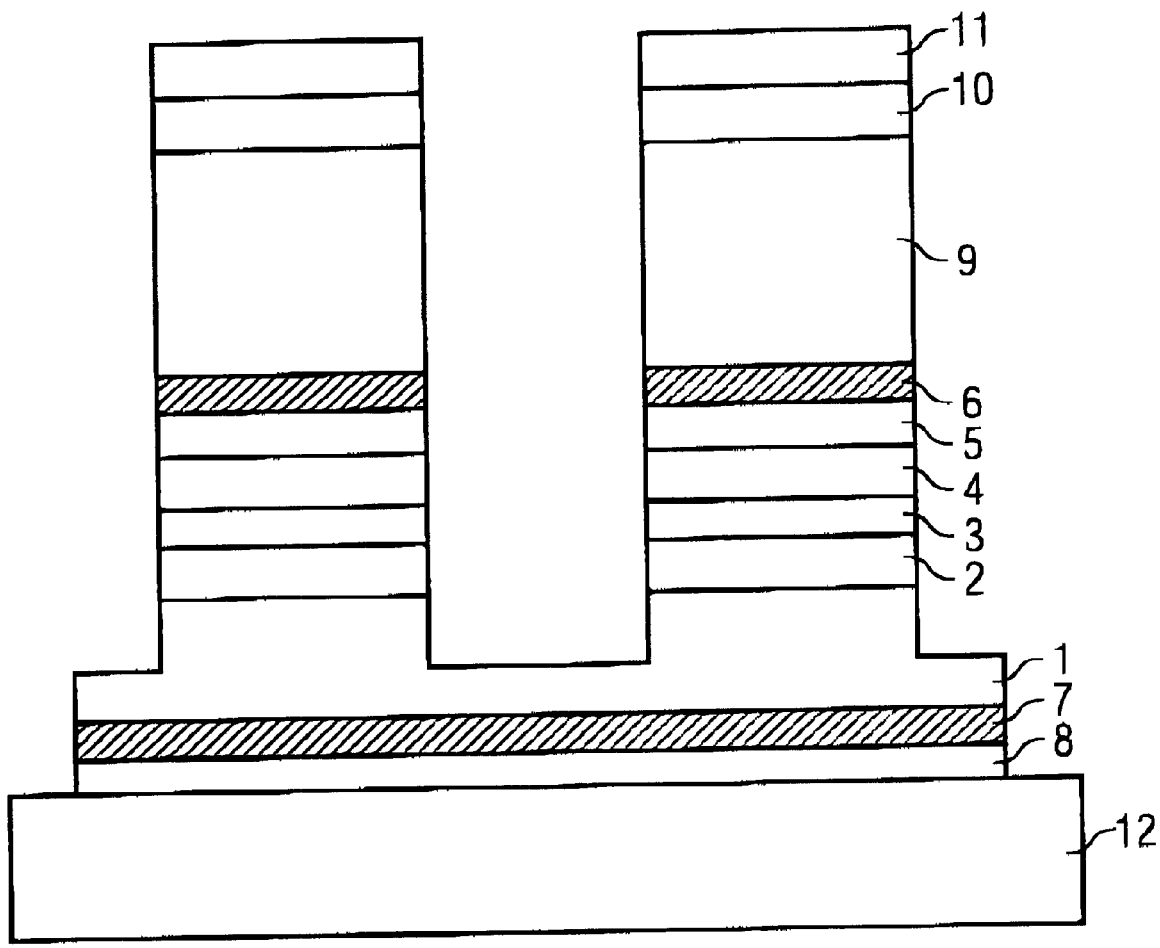

In a next step, the GaAs structure, including the metallization layers, will now be vertically etched to a select depth by dry etching in a reactive plasma. Thereby, in a first step, the etching series will be carried out to a resulting thickness of the GaAs wafer of approximately 30 $\mu$m. Then the interim product will be glued on an object carrier cover glass 12 (FIG. 1E) with glycolphtalate or picein for mechanical stability. The final state of the etching step and the gluing of the cover glass is shown in FIG. 1E.

In the following etching step (FIG. 1F) the remaining thickness of the GaAs wafer is etched through to the supporting layer 8 of $Si_3N_4$. Optical ending point identification can be used for the control of the etching steps. The etching can further be carried out in a multiple step process, to keep low the thermic strain of the glue, at the border area between the $Si_3N_4$ supporting layer 8 and the cover glass 12. The final result of this etching series is shown in FIG. 1F.

For the above etching steps, the following may be used: reactive ion etching (RIE), reactive ion beam etching (RIBE), chemically supported ion beam etching (CAIBE) and plasma etching by use of a inductively coupled plasma (ICP), preferably by use of chlorine chemistry, including for example borchloride, silicone tetrachloride, or elementar chloride and combinations of the above mentioned substances.

The etching series is carried out in two phases because the heat departure during the etching series is relatively high and the glue, with which the cover glass is glued on, should be thermically strained as little as possible. In principle, the etching series can also be carried out in one step, whereby the cover glass can be glued on before this step.

The supporting layer 8 of $Si_3N_4$ serves only to make it easier to later detach the cover glass. The supporting layer is extremely stable and voltage resistant, because the post first etching step built semiconductor device is only supported by this supporting layer 8 before the gluing of the cover glass. As such, the supporting layer 8, as mentioned above, is grown on by PE-CVD.

The supporting layer 8 serves, together with the cover glass 12, as a carrier for the diode arrangement, as is shown in FIG. 1F. However, it Is within the scope of the present invention that the supporting layer 8 is left out and the cover glass, initially or after a first etching step, is glued directly on the first metallization layer 7.

In the FIG. 1G depicted method step, the etching mask structure, comprising photo resist layers 9 to 11 as well as the supporting layer 12, is removed by plasma etching or a lift off process known to one skilled in the art. Accordingly, a diode arrangement, in the form of a matrix, from the square GaAs-LEDs, in a cross section, is arrived at and are supported by the cover glass 12 with the intermediate lying supporting layer 8.

Figure 1H:
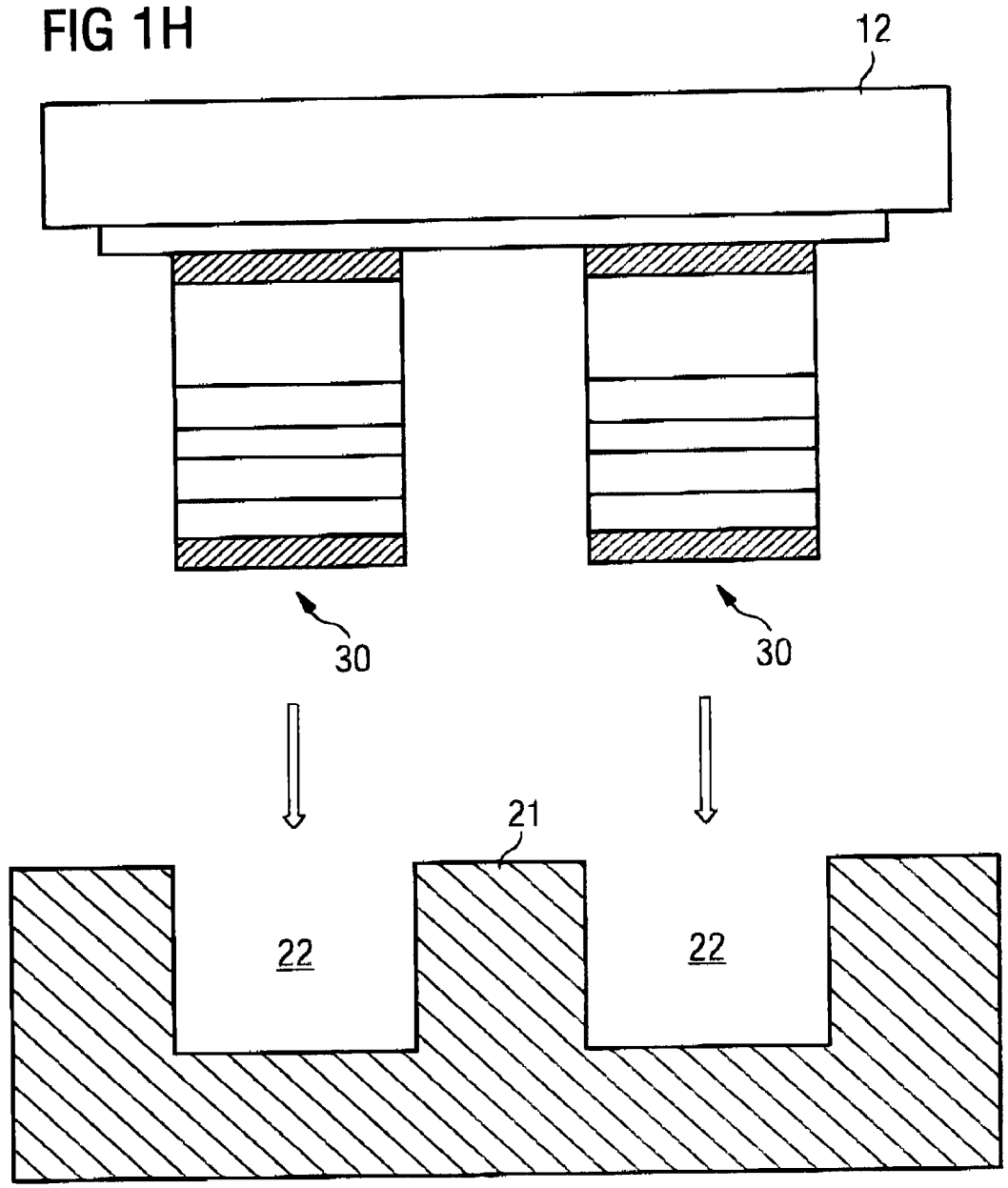
Figure 2:
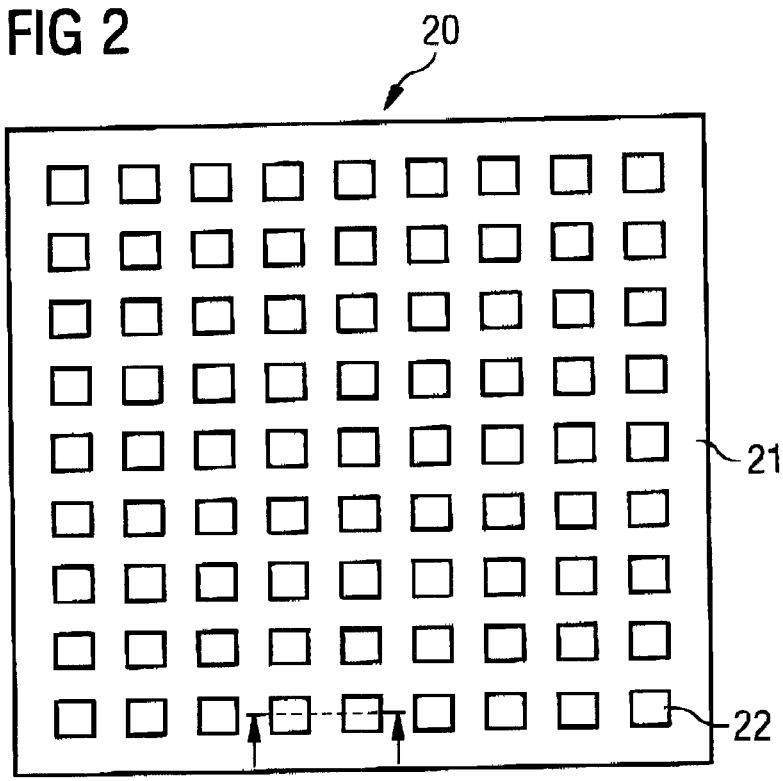
FIG. 2 depicts a supporting device for the inclusion of the LED-matrix.

FIGS. 1H, 1I and 2 will now be discussed with an emphasis on a process for forming the GaAs light emitting diodes. To aid in the formation process, a securely accommodating device 20, shown in FIG. 2 is employed. The device 20, also described as a letter case, includes a substrate 21, which may comprise a semiconductor or a metal. Slots 22, in the form of a matrix, are formed into the substrate 21, whose size and raster correspond to that depicted in method steps 1A to 1G produced GaAs-LED matrix. For reasons of clarity FIG. 2 shows a matrix of only 9×9 slots 22. The individual slots 22 serve to receive the individual pilaster shaped GaAs-LEDs. Because of this function, the slots have a squarish cross section, which is only minimally larger than the cross section of the GaAs-LEDs, GaAs can for example be used as a suitable material for device 20 and has already shown in early testing to be very practicable. An approximately 100 $\mu$m thick GaAs-wafer can be used as a starting point. The slots show a height of approximately 60–70 $\mu$m, so that the GaAs-LEDs can be accommodated therein up to approximately two thirds of their length. Material for the letter case may also comprise a semiconductor, such as silicone, or a metal. An additional advantage of the letter case is its possibility for repeated use.

The use of the accommodating device 20 is depicted in FIGS. 1H and 1I. Herein, the lower section of the picture depicts two adjacent slots 22 which correspond to a cross section per the broken line in FIG. 2. The LED arrangement is positioned proximate to the letter case until it engages within the letter case. The relatively simple alignment can be carried out by looking through a conventional stereo microscope.

Now that the pilaster shaped GaAs-LEDs are somewhat defined, the cover glass 12 and the $Si_3N_4$ layer 8 can be removed with application of acid and/or acetone (FIG. 1I). The GaAs-LEDs 30 are now individually accessible to micromanipulators. The LEDs can, for example, be used individually encapsulated and as radiation sources for various applications and purposes. In addition, a LED display device of a high density can be produced through use of a device 20 supported arrangement of individual microscopic GaAs-LEDs 30. Because the individual LEDs 30 in the letter case are already arranged in a high density matrix, the arrangement can be used as a starting point for a corresponding LED display device.

Figure 3:
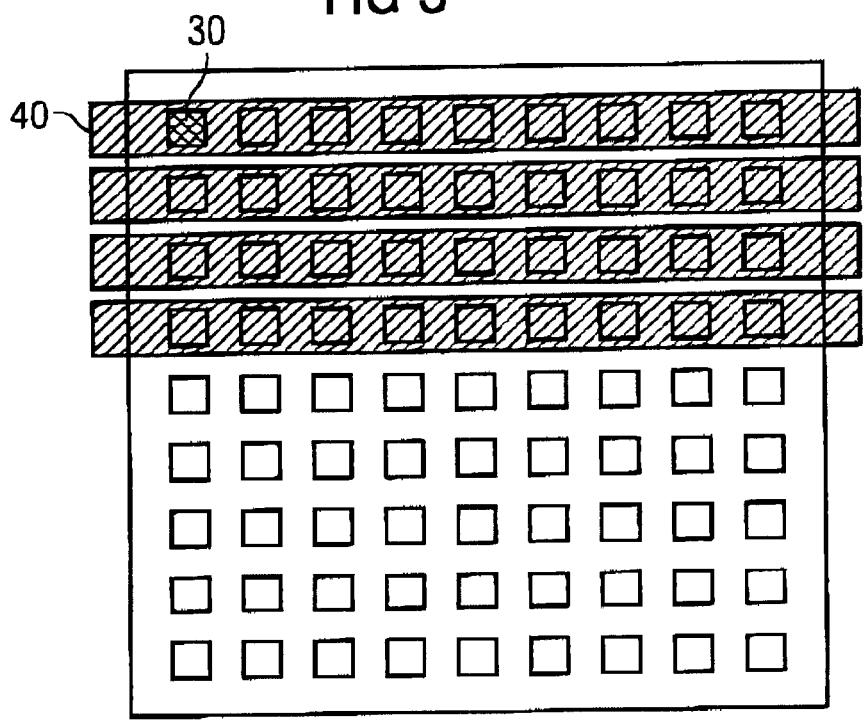
FIG. 3 depicts installation of a first conductor strip during production of a LED display device with the aid of the supporting device shown in FIG. 2.

A method for the production of a LED display device is shown in FIG. 3. Herein, a view of the device 20 is again shown, in whose slots of individual GaAs-LEDs 30 are inserted. The metallization layer 7 of the n-side of the LEDs points upwards. A plurality of first strip conductors 40 are applied in such a way that the LEDs of a cell are contacted together by the strip conductor. As further depicted in FIG. 3, the upper four rows of the matrix are contacted by four strip conductors After all rows of the matrix are accordingly contacted, the LEDs, at the strip conductors, can be lifted out of the letter case.

Figure 4:
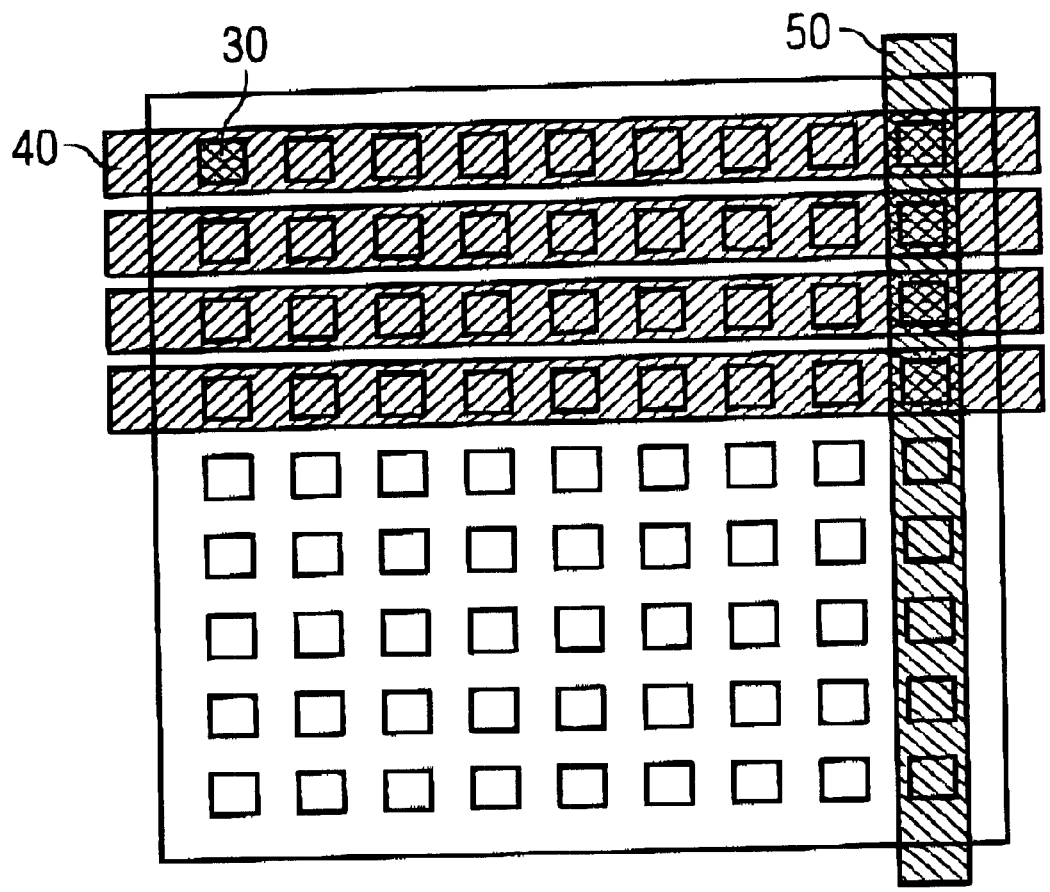
FIG. 4 depicts the installation of a second conductor strip during the production of a LED display device.

As shown in FIG. 4, the opposite side of the LEDs positioned metallization layers 6, of the p-side, are also contacted with second strip conductor 50. But this time the LEDs along a column of the matrix are contacted together by a strip conductor By way of example, in FIG. 5, the LEDs of the outermost right column of the diode arrangement are contacted with a strip conductor. The second strip conductor 50 runs therefore vertically with respect to the n-side contacted strip conductors 40.

In principle a particular GaAs-LED can be selectively stimulated, by impinging with a current the related columns, rows, and conductors. Although the light is emitted to the side, because the GaAs-LEDs are border emitters, enough scattered light is produced to contact an observers eye despite the presence of the conductors.

Alternative to the above described method, the GaAs-LEDs can first be lifted off the letter case With an adhesive film, on which then first the metallization layers of the LEDs turned away from the film are contacted with conductors, and after taking off the film, the then exposed metallization areas of the LEDs are contacted with conductors.

The invention being thus described, it will be obvious that the same may be varied in many ways. Such variations are not to be regarded as a departure from the spirit and scope of the invention, and all such modifications would be obvious to one skilled in the art are intended to be included within the scope of the following claims.

I claim:

1. A method for the production and formation of semiconductor light emitting diodes comprising the steps of:

producing a semiconductor light emitting device having at least one pn-junction and at least one metallization layer;

applying an etching mask having a first mask arrangement on one side of the semiconductor device, said arrangement defining covered and open areas of the semiconductor device;

applying a carrier on the other side of the semiconductor device;

vertically etching the semiconductor material within said open areas from said one side to said carrier;

removing said etching mask thereby exposing remaining portions of said semiconductor light emitting device not previously covered by said mask, said remaining portions comprising light emitting diodes;

engaging said light emitting diodes with an accommodating device, said device comprising slots arranged to individually receive each of said light emitting diodes; and removing said carrier.

2. The method according to claim 1, wherein said step of applying an etching mask further comprises the steps of:

applying a first photoresist layer on said one side of the semiconductor light emitting device;

applying a first supporting layer onto said photoresist layer;

applying a second photoresist layer onto said supporting layer, structuring said second photoresist layer by photolithography such that said second photoresist layer corresponds to said covered areas; and etching the first supporting layer and first photoresist layer to have similar widths as the second photoresist layer.

3. The method according to claim 2, wherein said first supporting layer comprises $SiO_2$.

4. The method according to claim 2, wherein said first supporting layer comprises $Al_2O_3$.

5. The method according to claim 2, wherein said first supporting layer comprises $Si_3N_4$.

6. The method according to claim 2, wherein said etching is performed by dry etching using a fluoride.

7. The method according to claim 6, wherein said dry etching is performed using $CF_4$.

8. The method according to claim 6, wherein said dry etching is performed using $CF_4O_2$.

9. The method according to claim 6, wherein said dry etching is performed using $CF_4O_2$.

10. The method according to claim 2, wherein said etching is performed by reactive dry etching using oxygen.

11. The method according to claim 10, wherein said step of etching is performed by reactive dry etching using $O_2/Ar$.

12. The method according to claim 1, wherein said step of applying a carrier is performed prior to said step of applying an etching mask.

13. The method according to claim 1, wherein prior to the application of said carrier is said semiconductor material is partially etched within said open areas from said one side.

14. The method according to claim 1, wherein said carrier comprises a second supporting layer and a cover glass, and said second supporting layer is applied during said step of producing a semiconductor light emitting device and said cover glass is applied during said step of applying a carrier.

15. The method according to claim 1, wherein said semiconductor light emitting device comprises a wafer having a first metallization layer on one surface thereof and a layering sequence on another surface thereof, said layering sequence comprising said pn-junction and a second metallization layer.

16. The method according to claims 15, whereby said first metallization layer is applied on said second supporting layer.

17. The method according to claim 16, whereby said second supporting layer comprises $Si_3N_4$ and is formed by plasma enhanced chemical vapor deposition.

18. The method according to claim 16, whereby said supporting layer comprises $SiO_2$ and is formed by plasma enhanced chemical vapor deposition.

19. The method according to claim 15, further comprising the steps of:

contacting each of said first metallization layers of said diodes with a strip conductor;

extracting said diodes from said accommodating device; and contacting each of said second metallization layers with a second strip conductor.

20. The method according to claim 15, further comprising the steps of:

gluing a film on said first metallization layer of said diodes;

extracting the diodes from said accommodating device;

applying first strip conductors on each of said second metallization layers of said diodes; and removing said film and applying second strip conductors on said first metallization layers.

21. The method according to claim 1, wherein said covered areas define a matrix of at least one row and column.

22. The method according to claim 15, wherein said wafer comprises GaAs.

* * * * *

UNITED STATES PATENT AND TRADEMARK OFFICE
CERTIFICATE OF CORRECTION

PATENT NO. : 6,475,819 B2
DATED : November 5, 2002
INVENTOR(S) : Gerhard Franz

It is certified that error appears in the above-identified patent and that said Letters Patent is hereby corrected as shown below:

Column 4,
Line 66, should read as follows:
-- chemistry, for example pure $CF_4$ or $CF_4/O_2$ formed into the --

Column 8,
Line 3, Claim 8 should read as follows:

-- 8. The method according to claim 6, wherein said dry etching is performed using $CF_4/O_2$. --
Line 5, Claim 9 should be cancelled.
Line 14, Claim 13 should read as follows:

-- 13. The method according to claim 1, wherein prior to the application of said carrier, said semiconductor material is partially etched within said open areas from said one side. --

Signed and Sealed this

Thirteenth Day of April, 2004

JON W. DUDAS
*Acting Director of the United States Patent and Trademark Office*